United States Patent
Hoilien et al.

(10) Patent No.: US 12,015,079 B2
(45) Date of Patent: Jun. 18, 2024

(54) TRANSISTOR WITH SINGLE TERMINATION TRENCH HAVING DEPTH MORE THAN 10 MICRONS

(71) Applicant: Polar Semiconductor, LLC, Bloomington, MN (US)

(72) Inventors: Noel Hoilien, Minneapolis, MN (US); Peter West, Minneapolis, MN (US); Rajesh Appat, Eagan, MN (US)

(73) Assignee: Polar Semiconductor, LLC, Bloomington, MN (US)

( * ) Notice: Subject to any disclaimer, the term of this patent is extended or adjusted under 35 U.S.C. 154(b) by 85 days.

(21) Appl. No.: 17/460,747

(22) Filed: Aug. 30, 2021

(65) Prior Publication Data

US 2023/0065066 A1  Mar. 2, 2023

(51) Int. Cl.
*H01L 29/739* (2006.01)
*H01L 29/10* (2006.01)
*H01L 29/66* (2006.01)

(52) U.S. Cl.
CPC ...... *H01L 29/7393* (2013.01); *H01L 29/1095* (2013.01); *H01L 29/66325* (2013.01)

(58) Field of Classification Search
CPC ............. H01L 29/0642; H01L 29/0649; H01L 29/0653; H01L 29/0696; H01L 29/0817; H01L 29/1004; H01L 29/1095; H01L 29/4236; H01L 29/42304; H01L 29/42352; H01L 29/66621; H01L 29/66628; H01L 29/7393; H01L 29/66242; H01L 29/66318; H01L 29/66325; H01L 29/66333; H01L 21/0475; H01L 21/31055; H01L 21/31116; H01L 21/31138; H01L 21/67096; H01L 21/32134; H01L 21/67023; H01L 21/67075; H01L 21/76205–7621; H01L 21/76224–76237; H01L 21/76283–76286; H01L 2924/1305–13056; H01L 21/7846;
(Continued)

(56) References Cited

U.S. PATENT DOCUMENTS 5,093,283 A * 3/1992 Rowe ............... H01L 21/56
438/421
6,204,097 B1 * 3/2001 Shen ............... H01L 29/7811
257/E29.066
(Continued)

OTHER PUBLICATIONS

U.S. Ex Parte Quayle Action dated Feb. 16, 2022 for U.S. Appl. No. 15/929,591; 11 Pages.
(Continued)

*Primary Examiner* — Natalia A Gondarenko
(74) *Attorney, Agent, or Firm* — DALY, CROWLEY, MOFFORD & DURKEE, LLP

(57) ABSTRACT

In one aspect, a method of fabricating a transistor includes depositing a first epitaxial layer; depositing a second epitaxial layer on the first epitaxial layer; forming a single termination trench in the second epitaxial layer; and filling the termination trench with a dielectric. A depth of the termination trench is greater than 10 microns. In another aspect, a transistor includes a first epitaxial layer; a second epitaxial layer on the first epitaxial layer; and a single termination trench in the second epitaxial layer. The termination trench is greater than 10 microns and is filled with a dielectric.

17 Claims, 4 Drawing Sheets

(58) Field of Classification Search
CPC ..... H01L 21/823493; H01L 21/823481; H01L 21/823878; H01L 21/823892; H01L 21/8249; H01L 29/66234–66348; H01L 29/73–7378; H01L 29/739–7398; H01L 29/04; H01L 29/6634; H01L 29/7395; H01L 29/76; H01L 29/84; H01L 29/94; H01L 29/0619–0623; H01L 29/7811; H01L 29/7823; H01L 21/2257; H01L 21/2255; H01L 21/2256; H01L 21/761; H01L 21/768; H01L 21/76229; H01L 21/76232; H01L 21/76297; H01L 21/76235; H01L 21/76208; H01L 21/76221; H01L 21/762; H01L 21/8238; H01L 29/417; H01L 29/7397; H01L 29/402
USPC ........ 438/424, 243, 386; 257/139, 419, 417, 257/254
See application file for complete search history.

(56) References Cited

U.S. PATENT DOCUMENTS

| | | | |
|---|---|---|---|
| 9,741,570 B1* | 8/2017 | Dainese | H01L 29/0661 |
| 2009/0050932 A1 | 2/2009 | Lu et al. | |
| 2009/0250705 A1 | 10/2009 | Watanabe et al. | |
| 2011/0233666 A1* | 9/2011 | Lui | H01L 29/66734 257/334 |
| 2013/0277793 A1 | 10/2013 | Lee et al. | |
| 2014/0284625 A1 | 9/2014 | Kagotoshi et al. | |
| 2016/0087045 A1 | 3/2016 | Shimizu | |
| 2017/0250258 A1* | 8/2017 | Yang | H01L 29/66136 |
| 2019/0035927 A1 | 1/2019 | Iwaya et al. | |
| 2020/0075735 A1* | 3/2020 | Yoshida | H01L 21/765 |
| 2020/0303528 A1* | 9/2020 | Thees | H01L 29/66068 |
| 2021/0328054 A1 | 10/2021 | Hoilien | |
| 2021/0359115 A1 | 11/2021 | Hoilien | |
| 2022/0045205 A1* | 2/2022 | Blanchard | H01L 29/7455 |

OTHER PUBLICATIONS

Response to U.S. Ex Parte Quayle Action dated Feb. 16, 2022 for U.S. Appl. No. 15/929,591; Response filed Feb. 17, 2022; 8 Pages.
U.S. Notice of Allowance dated Mar. 23, 2022 for U.S. Appl. No. 15/929,591; 8 Pages.
Restriction Requirement dated Apr. 16, 2021 for U.S. Appl. No. 16/853,072; 6 Pages.
Response to Restriction Requirement dated Apr. 16, 2021 for U.S. Appl. No. 16/853,072; Response Filed Jun. 14, 2021; 1 Page.
U.S. Non-Final Office Action dated Aug. 5, 2021 for U.S. Appl. No. 16/853,072; 10 Pages.
Response to U.S. Non-Final Office Action dated Aug. 5, 2021 for U.S. Appl. No. 16/853,072; Response Filed Oct. 4, 2021; 12 Pages.
U.S. Notice of Allowance dated Dec. 21, 2021 for U.S. Appl. No. 16/853,072; 7 Pages.

\* cited by examiner

TRANSISTOR WITH SINGLE TERMINATION TRENCH HAVING DEPTH MORE THAN 10 MICRONS

BACKGROUND

An insulated-gate bipolar transistor (IGBT) is a three-terminal power semiconductor device. Typically, the IGBT is used as a switch in high-voltage applications. Compared to a power bipolar junction transistor (BJT) or a power metal-oxide-semiconductor field-effect transistor (MOSFET), the IGBT has a higher voltage rating and a higher current rating. Compared to a MOSFET, the IGBT has a higher switching frequency.

Typically, the IGBT includes more than one termination trench, and the termination trenches are about 5 microns in depth. The purpose of the termination trenches is to manage the horizontal electric field at a die perimeter to ensure a termination breakdown voltage exceeds a main cell breakdown voltage. In some examples, the IGBT has 30 termination trenches.

SUMMARY

In one aspect, a method of fabricating a transistor includes depositing a first epitaxial layer; depositing a second epitaxial layer on the first epitaxial layer; forming a single termination trench in the second epitaxial layer; and filling the termination trench with a dielectric. A depth of the termination trench is greater than 10 microns.

In another aspect, a transistor includes a first epitaxial layer; a second epitaxial layer on the first epitaxial layer; and a single termination trench in the second epitaxial layer. The termination trench is greater than 10 microns and is filled with a dielectric.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a transistor with a single termination trench. In one example, the transistor is a trench insulated-gate bipolar transistor (IGBT). In another example, the transistor is a metal-oxide-semiconductor field-effect transistor (MOSFET). The single termination trench may be greater than 10 microns in depth. In one example, the single termination trench may be between 20 and 60 microns in depth. In one particular example, the single termination trench may be about 40 microns in depth with a 1- to 2-micron variation.

The techniques described herein enable a more robust termination breakdown voltage (BV) to be formed in the transistor than traditional techniques. As used herein, a robust breakdown voltage means that there is a minimal decrease in breakdown voltage across the expected amount of process variation. It can be measured electrically by comparing BV of IGBTs fabricated under nominal process conditions and "extreme" process conditions.

The techniques described herein also may provide for transistors that have a BV mechanism that is more reliable than traditional techniques. For example, breakdown reliability may be measured by repeated breakdown measurements and/or stressing devices at a voltage near the breakdown voltage. The techniques described herein reduce the amount of processing masks and processing steps that are used to manufacture a transistor.

Figure 1A:
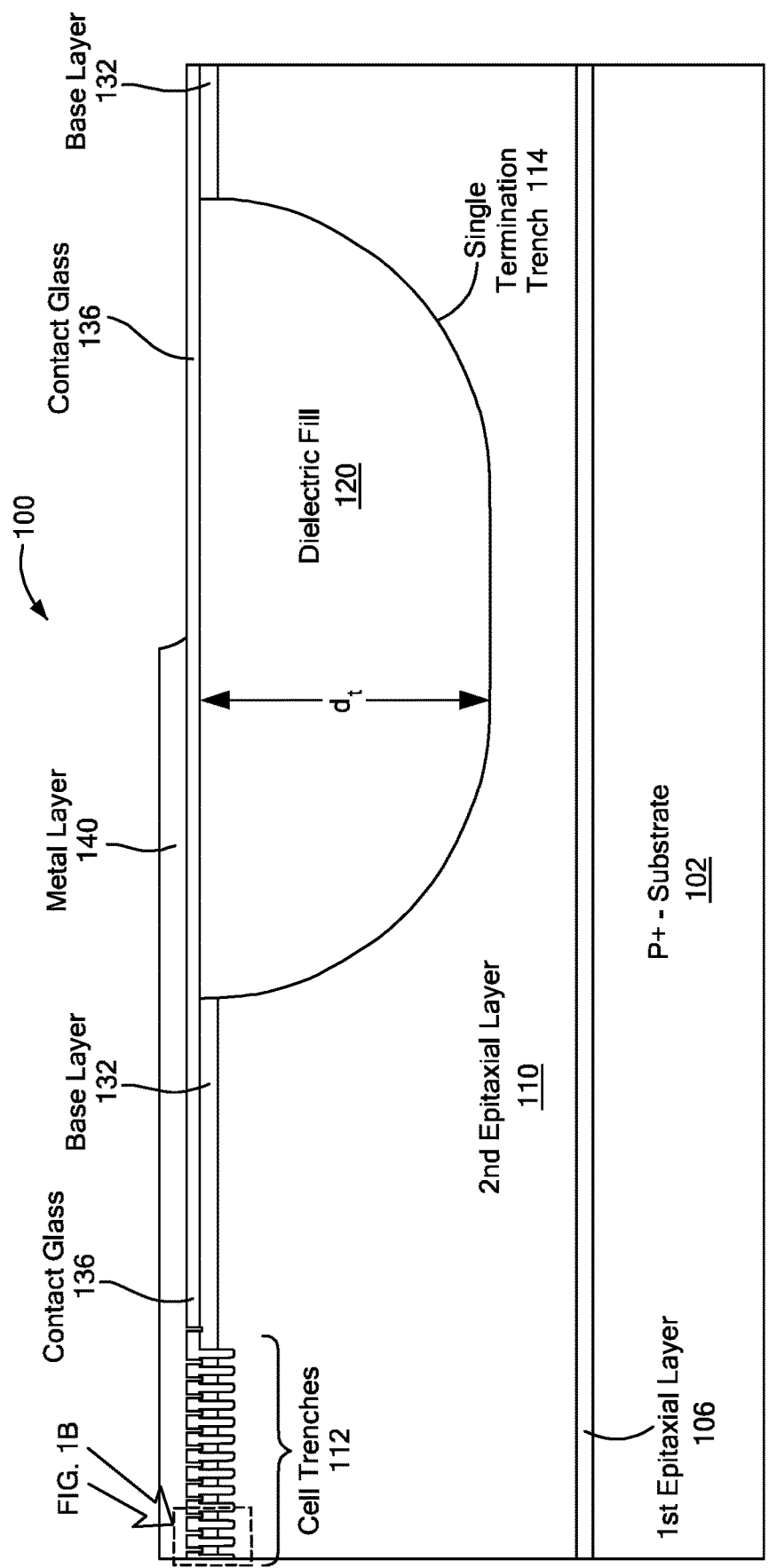
FIGS. 1A and 1B are diagrams of an example of a transistor with a single termination trench more than 10 microns in depth.
Figure 1B:
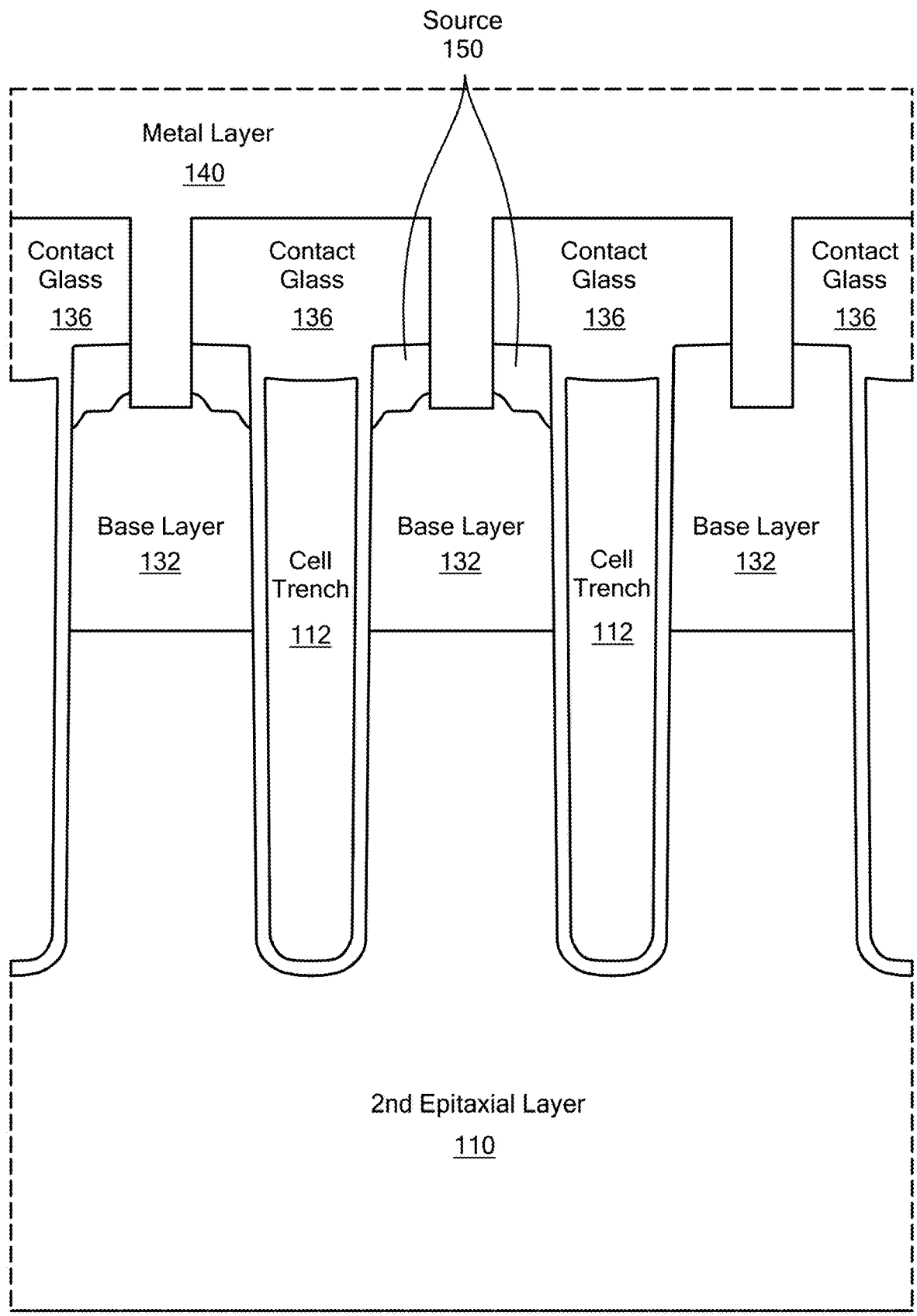

Referring to FIGS. 1A and 1B, a transistor 100 (e.g., IGBT) includes a P+-substrate 102, a first epitaxial layer 106 on the P+-substrate 102 and a second epitaxial layer 110 on the first epitaxial layer 106. The P+-substrate 102 is a collector of the transistor 100.

The transistor 100 also includes cell trenches 112, a base layer 132 implanted into the second epitaxial layer 110, contact glass 136 disposed on the base layer 132 and a metal layer 140 deposited on the contact glass 136. The cell trenches perform a switching function.

The transistor 100 further includes a single termination trench 114 filled with a dielectric 120. The termination trench is configured to maximize the breakdown voltage. The dielectric 120 is in contact with the base layer 132 and the contact glass 136. The base layer 132 is the base for the transistor 100.

In one example, the depth $d_t$ of the single termination trench is greater than 10 microns. In one example, the depth $d_t$ of the single termination trench may be between 20 and 60 microns in depth. In one particular example, the depth $d_t$ of the single termination trench may be about 40 microns in depth with a 1- to 2-micron variation.

While FIG. 1A depicts the single termination trench 114 extending only into the second epitaxial layer 110, in other embodiments, the single termination trench 114 may extend through the second epitaxial layer 110 into the first epitaxial layer 106 or the single termination trench 114 may extend through the second epitaxial layer 110 into the first epitaxial layer 106 and into the P+ substrate 102.

Near the cell trenches 112, a source 150 of the transistor 100 is located on the base layer 132 and covered by the contact glass 136. The metal layer 140 extends through the contact glass 136 to the base layer 132. The metal layer 140 may also extend through the source 150.

Figure 2A:
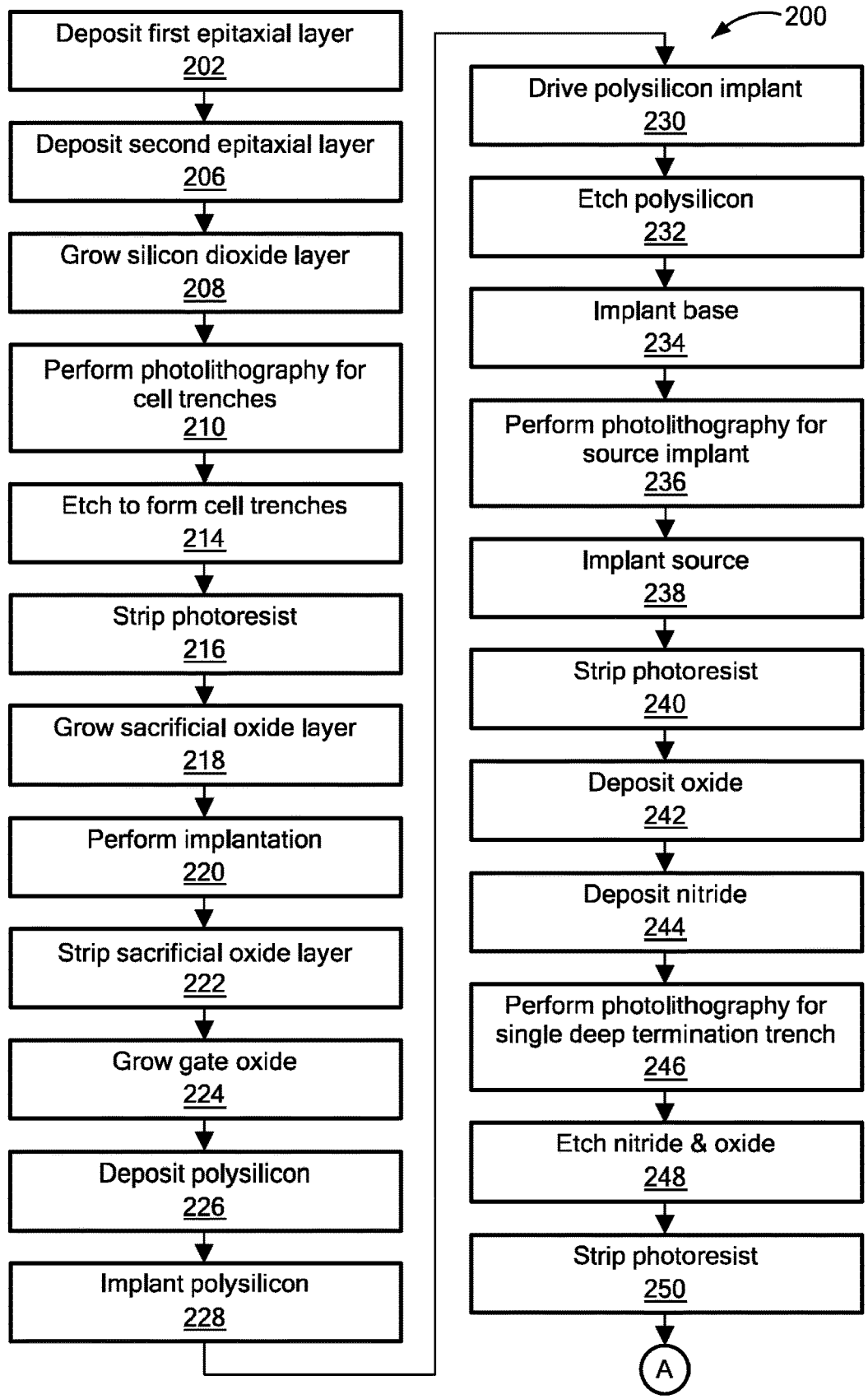
FIGS. 2A and 2B are a flowchart of an example of a process to fabricate a transistor with a single termination trench more than 10 microns in depth.
Figure 2B:
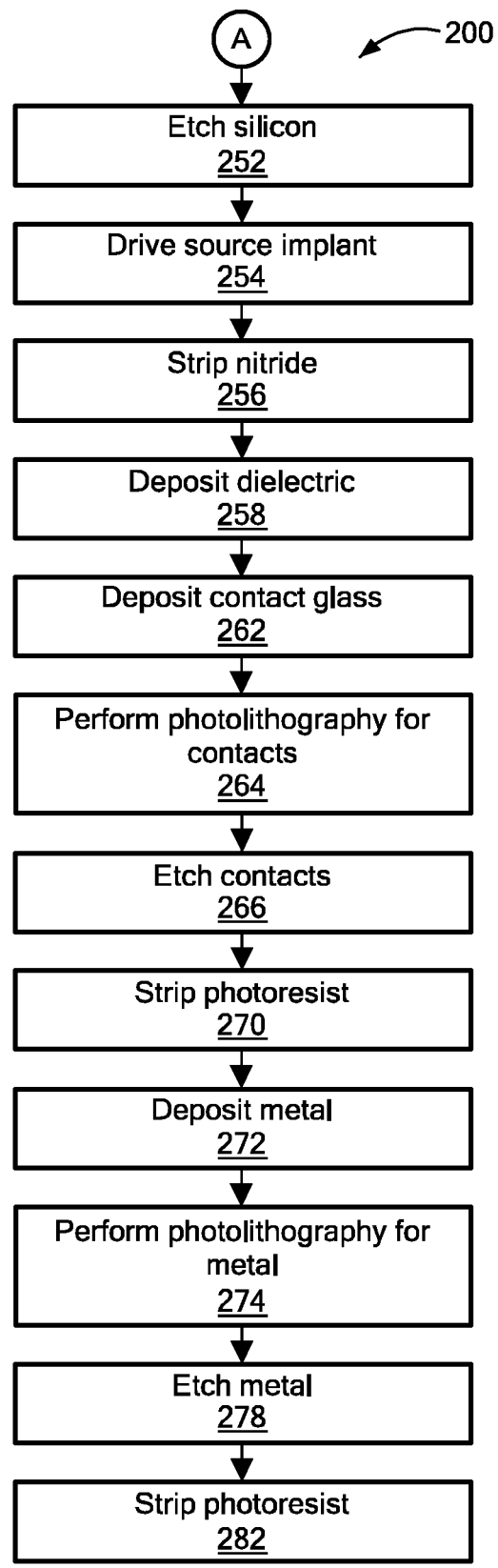

Referring to FIG. 2, an example of a process to form a transistor with a single termination trench more than 10 microns in depth is a process 200. In one example, the transistor may be the transistor 100 shown in FIGS. 1A and 1B.

Process 200 deposits a first epitaxial layer (202). For example, the first epitaxial layer 106 may be deposited on the P+-substrate 102 (FIG. 1A). In one example, the epitaxial layer 106 may be grown having a thickness of about 8 microns. In one example, the first epitaxial layer 106 may include phosphorous as a doping material and has a resistivity of about 0.050 Ohm-cm.

Process 200 deposits a second epitaxial layer (206). For example, the second epitaxial layer 110 may be deposited on the first epitaxial layer 106 (FIG. 1A). In one example, the epitaxial layer 110 may be grown having a thickness of about 58 microns. In one example, the second epitaxial layer 110 may include phosphorous as a doping material and has a resistivity of about 33 Ohm-cm.

Process 200 grows a silicon dioxide layer (208). For example, a silicon dioxide layer may be grown on the second epitaxial layer 110. In one example, the silicon dioxide layer is 0.5 microns thick. In one example, the silicon dioxide layer is used as a trench hard mask.

Process 200 performs photolithography to form cell trenches (210). For example, a photoresist is applied to the silicon dioxide layer grown in processing block 208 and additional photolithographical steps are performed to remove portions of the photoresist exposing one or more portions of the silicon dioxide layer where the cell trenches 112 (FIGS. 1A and 1B) will be located.

Process 200 etches to form cell trenches (214). For example, the one or more exposed portions of the silicon dioxide layer grown in processing block 208 are removed along with the portions of the second epitaxial layer 110 underneath the exposed silicon dioxide layer grown in processing block 208 using a dry or wet etching process.

Process 200 strips the photoresist (216). For example, the photoresist applied in processing block 210 is removed.

Process 200 grows a sacrificial oxide layer (218). For example, a sacrificial silicon dioxide layer is grown on the second epitaxial layer 110 (FIGS. 1A and 1B). In one example, the sacrificial oxide layer grown is used to oxidize the exposed silicon for the cell trenches. For example, a 1500 Angstrom oxide layer is grown by wet oxidation at 1000° C.

Process 200 performs implantation (220). For example, a doping material is implanted through the sacrificial oxide and through the one or more exposed portions of the silicon dioxide layer into the second epitaxial layer 110 (FIGS. 1A and 1B) through the cell trenches 112. In one particular example, the doping material is phosphorus. In one example, the peak doping of the phosphorus is about $5 \times 10^{15}/cm^3$. In some examples, the implantation is formed using ion implantation of at least 70 keV. In some examples, the ion implantation has a dosing of at least $1.0 \times 10^{12}$ ions/cm². In some examples, the dosing ions (e.g., phosphorus ions) are implanted at an angle of 0 degrees.

Process 200 strips the sacrificial oxide layer (222). For example, the sacrificial oxide layer grown in processing block 218 is removed using a wet etching technique. In one example, all of the sacrificial oxide layer grown in processing block 218 is removed. In some example, the silicon dioxide layer grown in processing block 208 is also removed.

Process 200 grows gate oxide (224). For example, a gate oxide that is 1000 Angstroms thick is grown using wet oxidation techniques at 900° C. For example, about 20% of each of the cell trenches 112 is filled with the gate oxide.

Process 200 deposits polysilicon (226). For example, a 15,000 Angstrom thick layer of polysilicon is deposited using low pressure chemical vapor deposition (LPCVD) on the gate oxide. For example, each of the cell trenches 112 is mostly filled by the polysilicon.

Process 200 implants polysilicon (228). For example, a doping material is implanted through the polysilicon. In one example, the polysilicon is implanted with phosphorous. In one example, the phosphorous is implanted at 70 keV and at a doping level greater than $1 \times 10^{16}/cm^3$.

Process 200 drives polysilicon implant (230). For example, the polysilicon is heated to 1100° C. driving the phosphorous ions, for example, deeper into the polysilicon.

Process 200 etches polysilicon (232). For example, the polysilicon may be etched using dry etching techniques. In one example, all of the polysilicon is removed except some polysilicon, which remains in the cell trenches 112, recessed about 0.20 microns below the surface of the silicon.

Process 200 implants base (234). For example, the surface of the second epitaxial layer is ion implanted with boron to form a base layer (e.g., the base layer 132 (FIG. 1) along a top surface of the second epitaxial layer. In one example, the surface not masked from any part of the wafer by photoresist is blanket implanted.

Process 200 performs photolithography for source implant (236). For example, a photoresist is applied to the surface and additional photolithographical steps are performed to remove portions of the photoresist exposing one or more portions of the surface.

Process 200 implants source (238). For example, the exposed portions of the surface are implanted with arsenic. In one example, the arsenic is implanted at 140 keV and at a dosing level of about $2 \times 10^{15}/cm^2$.

Process 200 strips photoresist (240). For example, the photoresist applied in processing block 236 is removed.

Process 200 deposits oxide (242). An oxide layer is deposited on the surface.

Process 200 deposits nitride (244). For example, a nitride is deposited on the oxide layer formed in processing block 242. In one example, a 1000 Angstrom thick layer of silicon nitride formed.

Process 200 performs photolithography to form the single termination trench (246). For example, a photoresist is applied to the nitride layer and additional photolithographical steps are performed to remove portions of the photoresist exposing one or more portions of the nitride layer where the single termination trench will be located.

Process 200 etches the nitride and the oxide (248). In one example, the nitride and the oxide are dry etched. In one example, the dry etching is reactive ion etching.

Process 200 strips the photoresist (250). For example, the photoresist applied in processing block 246 is removed.

Process 200 etches silicon (252). For example, a portion of the second epitaxial layer 110 (FIG. 1A), which includes the base layer 132 (FIG. 1A), not covered by the oxide and nitride is etched to form the single termination trench 114 (FIG. 1A) using dry or wet etching techniques. In one particular example, the silicon is etched using tetramethylammonium hydroxide (TMAH). In one example, the depth $d_t$ of the single termination trench (FIG. 1A) is greater than 10 microns. In one example, the depth $d_t$ of the single termination trench 114 (FIG. 1A) may be between 20 and 60 microns in depth. In one particular example, the depth $d_t$ of the single termination trench 114 (FIG. 1A) may be about 40 microns in depth with a 1- to 2-micron variation.

In one example, the second epitaxial layer 110 is only etched. In another example, the second epitaxial layer 110 and the first epitaxial layer 106 are etched. In a further example, the second epitaxial layer 110, the first epitaxial layer 106 and the P+-substrate 102 are etched.

Process 200 drives source implant (254). For example, the source 150 is heated to 1100° C. for 30 minutes to drive the arsenic further into the base layer 132.

Process 200 strips nitride (256). In one example, the nitride is stripped using hot phosphoric acid. In one example, all of the nitride is removed.

Process 200 deposits a dielectric (258). For example, a spin-on dielectric 120 may be applied to fill the termination trench 114 (FIG. 1A).

Process 200 deposits contact glass (262). For example, a 7,000 Angstrom borophosphosilicate glass (BPSG) layer is added and a 3000 Angstrom undoped silane glass (USG) layer is added.

Process 200 performs photolithography for contacts (264). For example, a photoresist is applied to the contact glass 136 and additional photolithographical steps are performed to remove portions of the photoresist exposing one or more portions of the contact glass 136 where the contacts will be located.

Process 200 etches to form contact regions (266). For example, the one or more exposed portions of the contact glass 136 may be etched using dry or wet etching techniques to form a contact region where subsequent metal will be deposited (see processing block 272 below). The etching extends through the contact glass 136 and through the source 150 to the base layer 132.

Process 200 strips photoresist (270). For example, the photoresist applied in processing block 264 is removed.

Process 200 deposits metal (272). For example, a layer of metal is deposited on the remaining contact glass 136 and on the base layer 132 using, for example, sputtering techniques. In one example, the metal layer includes aluminum silicon.

Process 200 performs photolithography for metal (274). For example, a photoresist is applied to the metal and additional photolithographical steps are performed to remove portions of the photoresist exposing one or more portions of the metal.

Process 200 etches metal (278). For example, the one or more exposed portions of the metal are etched using dry or wet etching techniques.

Process 200 strips photoresist (282). For example, the photoresist applied in processing block 246 is removed.

The processes described herein are not limited to the specific examples described. For example, the process 200 is not limited to the specific processing order of FIG. 2. Rather, any of the processing blocks of FIG. 2 may be re-ordered, combined, or removed, performed in parallel or in serial, as necessary, to achieve the results set forth above.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method of fabricating a transistor, comprising:
    depositing a first epitaxial layer;
    depositing a second epitaxial layer on the first epitaxial layer;
    ion implanting the second epitaxial layer to form a base layer along a top surface of the second epitaxial layer and implanting a source into the base layer, wherein the base layer is a base of the transistor;
    forming a single termination trench in the second epitaxial layer by etching the second epitaxial layer through the base layer so that the base layer is on either side of the trench, wherein a depth of the termination trench is greater than 10 microns;
    driving the source implanting by heating the source;
    filling the termination trench with a dielectric material, wherein the base layer on either side of the trench is in direct contact with the dielectric material; and
    depositing a contact glass on the dielectric material.

2. The method of claim 1, wherein the depth of the termination trench is between 20 and 60 microns in depth.

3. The method of claim 2, wherein the depth of the termination trench is about 40 microns in depth with a 1- to 2-micron variation.

4. The method of claim 1, wherein the transistor is a bipolar junction transistor or a metal-oxide-semiconductor field-effect transistor (MOSFET).

5. The method of claim 4, wherein the transistor is an insulated-gate bipolar junction transistor.

6. The method of claim 1, wherein forming a single termination trench in the second epitaxial layer comprises forming a single termination trench in the second epitaxial layer and the first epitaxial layer.

7. The method of claim 1, wherein depositing the first epitaxial layer comprises depositing the first epitaxial layer on a doped substrate, wherein the doped substrate is a collector of the transistor.

8. The method of claim 7, wherein the doped substrate is a P+ doped substrate.

9. The method of claim 7, wherein forming a single termination trench in the second epitaxial layer comprises forming a single termination trench in the second epitaxial layer and the first epitaxial layer.

10. The method of claim 9, wherein forming a single termination trench in the second epitaxial layer and the first epitaxial layer comprises forming a single termination trench in the second epitaxial layer, the first epitaxial layer and the doped substrate.

11. The method of claim 1, further comprising depositing a metal layer on the contact glass.

12. The method of claim 11, further comprising forming cell trenches in the second epitaxial layer.

13. The method of claim 12, wherein depositing the contact glass further comprises depositing the contact glass on the cell trenches.

14. The method of claim 13, wherein depositing the metal layer further comprises depositing the metal layer on the cell trenches.

15. The method of claim 1, wherein the contact glass includes a borophosphosilicate glass (BPSG) and a undoped silane glass (USG).

16. The method of claim 11, further comprising etching the metal layer.

17. The method of claim 11, wherein the metal layer includes aluminum silicon.

* * * * *